(12) United States Patent
Numata et al.

(10) Patent No.: US 6,465,150 B1
(45) Date of Patent: Oct. 15, 2002

(54) RADIATION-SENSITIVE RESIN COMPOSITION

(75) Inventors: Jun Numata; Shirou Kusumoto; Eiichi Kobayashi, all of Mie (JP)

(73) Assignee: JSR Corporation, Tokyo (JP)

( * ) Notice: Subject to any disclaimer, the term of this patent is extended or adjusted under 35 U.S.C. 154(b) by 21 days.

(21) Appl. No.: 09/686,930

(22) Filed: Oct. 12, 2000

(30) Foreign Application Priority Data

Oct. 12, 1999 (JP) ............................................ 11-289728

(51) Int. Cl.⁷ ................................................ G03F 7/004
(52) U.S. Cl. ................................ 430/270.1; 430/281.1; 430/914; 430/921
(58) Field of Search ........................... 430/270.1, 281.1, 430/914, 921

(56) References Cited

U.S. PATENT DOCUMENTS 5,731,364 A  * 3/1998 Sinta et al. .................... 522/31
6,037,107 A  * 3/2000 Thackeray et al. .......... 430/326
6,265,135 B1 * 7/2001 Kodama et al. .......... 430/286.1
6,280,900 B1 * 8/2001 Chiba et al. .............. 430/270.1

* cited by examiner

*Primary Examiner*—Rosemary Ashton
(74) *Attorney, Agent, or Firm*—Piper Rudnick LLP; Steven B. Kelber

(57) ABSTRACT

A radiation-sensitive resin composition exhibiting high sensitivity to various types of radiation and capable of forming a minute pattern with sufficient resolution and depth of field and small surface roughness in various types of patterns such as a dense line pattern, isolated line pattern, or contact holes, particularly in line-type patterns. The resin composition comprises (A) an aromatic sulfonic acid onium salt compound consisting of a 2,4-difluorobenzenesulfonic acid anion, 4-trifluoromethylbenzenesulfonic acid anion, or 2-trifluoromethylbenzenesulfonic acid anion, and an onium cation of sulfur or iodonium, and (B) a copolymer represented by a 4-hydroxystyrene/4-t-butoxystyrene copolymer and a 4-hydroxystyrene/4-(1'-ethoxyethoxy)styrene copolymer.

18 Claims, 1 Drawing Sheet

RADIATION-SENSITIVE RESIN COMPOSITION

BACKGROUND OF THE INVENTION

1. Field of the Invention

The present invention relates to a radiation-sensitive resin composition suitable as a chemically-amplified resist useful formicrofabrication utilizing various types of radiation such as ultraviolet rays, deep ultraviolet rays, X-rays, or charged particle rays.

2. Description of Background Art

In the field of microfabrication represented by fabrication of integrated circuit devices, the processing size has become more and more minute in order to achieve higher integration. In recent years, development of a lithographic process enabling stable microfabrication with a line width of 0.5 μm or less has been strongly demanded.

However, it is difficult to form such a fine pattern with high accuracy using a conventional method which utilizes visible rays (wavelength: 700–400 nm) or near ultraviolet rays (wavelength: 400–300 nm). To deal with this problem, a lithographic process using radiation with a shorter wavelength (wavelength: 300 nm or less) has been proposed. Such shorter wavelength radiation can achieve a wider range of depth of focus and is effective for ensuring design rules with minimum dimensions.

As examples of shorter wavelength radiation, deep ultraviolet rays such as a KrF excimer laser (wavelength: 248 nm) or an ArF excimer laser (wavelength: 193 nm), X-rays such as synchrotron radiation, charged particle rays such as electron beams, and the like can be given. International Business Machines Corporation (IBM) has proposed a "chemically-amplified resist" as a resist exhibiting high resolution for such shorter wavelength radiation. At present, improvement of the chemically amplified resist has been attempted.

The chemically-amplified resist contains a photoacid generator which generates an acid upon irradiation (hereinafter called "exposure"). Chemical changes in the resist coating (changes in polarity, breakage of a chemical bond, cross-linking reaction, etc.) caused by the catalytic action of an acid changes solubility of the exposed area in a developer. The resist pattern is formed utilizing this phenomenon.

In the chemically-amplified resist, the photoacid generator greatly affects functions as a resist. In these days, onium salt compounds, which generate an acid upon exposure in high quantum yield and exhibit high resolution, are widely used as the photoacid generator. The onium salt compounds contain an onium cation and a counter anion. The structure of the onium salt compounds has been extensively studied.

Among the resin components used in conventional chemically-amplified resists, the following resins are known as those exhibiting comparatively good resist performance: a resin in which an alkali affinitive group in an alkali-soluble resin is blocked by a t-butyl ester group or a t-butoxycarbonyl group (Japanese Patent Publication No. 27660/1990); a resin in which an alkali affinitive group in an alkali-soluble resin is blocked by a ketal group (Japanese Patent Application Laid-open No. 140666/1995); a resin in which an alkali affinitive group in an alkali-soluble resin is blocked by an acetal group such as an ethoxyethyl group and a tetrahydropyranyl group (Japanese Patent Applications Laid-open No. 161436/1990 and No. 249682/1993); a combination of a resin in which an alkali affinitive group in an alkali-soluble resin is blocked by a t-butoxycarbonyl group and a resin in which an alkali affinitive group in an alkali-soluble resin is blocked by an acetal group (Japanese Patent Applications Laid-open No. 15864/1996 and No. 31309/1998); and the like.

However, all these chemically-amplified resists have peculiar problems. In particular, various problems have been pointed out in putting these resists to practical use for microfabrication with a line width of 0.25 μm or less.

One of the problems is unevenness of the surface of the pattern (surface roughness). A rough surface hinders controlling the line width of the fine pattern with high accuracy. Another problem is that sufficient sensitivity, resolution, and depth of focus cannot be obtained when forming a dense line pattern, isolated line pattern, or contact holes, particularly line-type patterns, which fails to satisfy the requirements for memory circuits, logic circuits, or circuits installing both.

Japanese Patent Application Laid-open No. 167200/1999 discloses a photoresist composition exhibiting good sensitivity which comprises an onium salt compound such as di(4-t-butylphenyl)iodonium perfluorooctanesulfonate and di(4-t-butylphenyl)iodonium 2-trifluoromethylbenzenesulfonate and an alkali-soluble resin such as a 4-hydroxystyrene/styrene/t-butyl acrylate copolymer.

However, Japanese Patent Application Laid-open No. 167200/1999 has a subject still to be investigated, which is a correlation between the onium salt compound and the structure of the alkali-soluble resin in relation to recent major requirements for sensitivity, resolution, depth of focus, and surface roughness in various patterns. Therefore, this photo resist composition is unsatisfactory in view of overall characteristics as the chemically-amplified resist.

Accordingly, an object of the present invention is to provide a radiation-sensitive resin composition which exhibits high sensitivity to various types of radiation such as ultraviolet rays, deep ultraviolet rays, X-rays, and charged particle rays, has sufficient resolution and depth of focus, and is capable of forming a fine pattern with small surface roughness when forming various patterns such as a dense line pattern, isolated line pattern, or contact holes, particularly line-type patterns.

SUMMARY OF THE INVENTION

According to the present invention, the above object can be achieved by a radiation-sensitive resin composition comprising:

(A) an aromatic sulfonic acid onium salt compound shown by the following formula (1),

wherein $Z^+$ represents an onium cation of sulfur or iodine, and $X^-$ represents an anion shown by any of the following formulas (1-1) to (1-3);

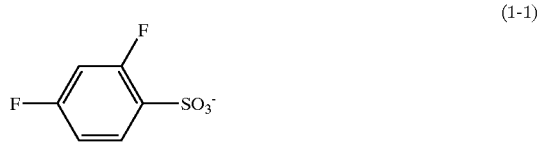

-continued

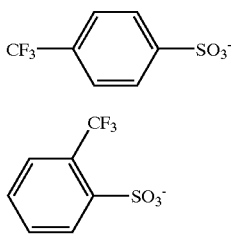
(1-2)

(1-3)

and (B) either one or both of a copolymer (I) which comprises a recurring unit shown by the following formula (2) and a recurring unit shown by the following formula (3),

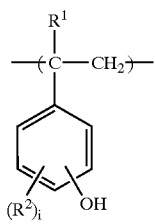
(2)

wherein $R^1$ represents a hydrogen atom or a methyl group, $R^2$ represents a halogen atom or an organic group having 1–6 carbon atoms, and i is an integer from 0 to 3;

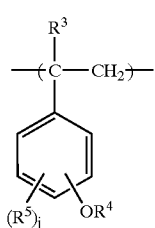
(3)

wherein $R^3$ represents a hydrogen atom or a methyl group, $R^4$ represents a tertiary alkyl group having 4–10 carbon atoms, $R^5$ represents a halogen atom or an organic group having 1–6 carbon atoms, and j is an integer from 0 to 3; and a copolymer (II) which comprises a recurring unit shown by the formula (2) and a recurring unit shown by the following formula (4):

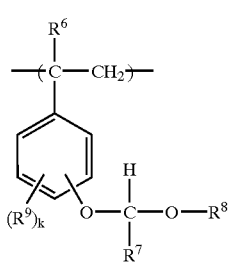
(4)

wherein $R^6$ represents a hydrogen atom or a methyl group, $R^7$ represents a linear, branched, or cyclic alkyl group having 1–6 carbon atoms, $R^8$ represents a linear, branched, or cyclic alkyl group having 1–6 carbon atoms, $R^9$ represents a halogen atom or an organic group having 1–6 carbon atoms, and k is an integer from 0 to 3.

In the formulas (2) to (4), the organic group having 1–6 carbon atoms excludes —$OR_4$ in the formula (3) and —O—CH($R^7$)—O—CH$_2$—$R^8$.

Other objects, features and advantages of the invention will hereinafter become more readily apparent from the following description.

DETAILED DESCRIPTION OF THE INVENTION AND PREFERRED EMBODIMENT

Figure 1:
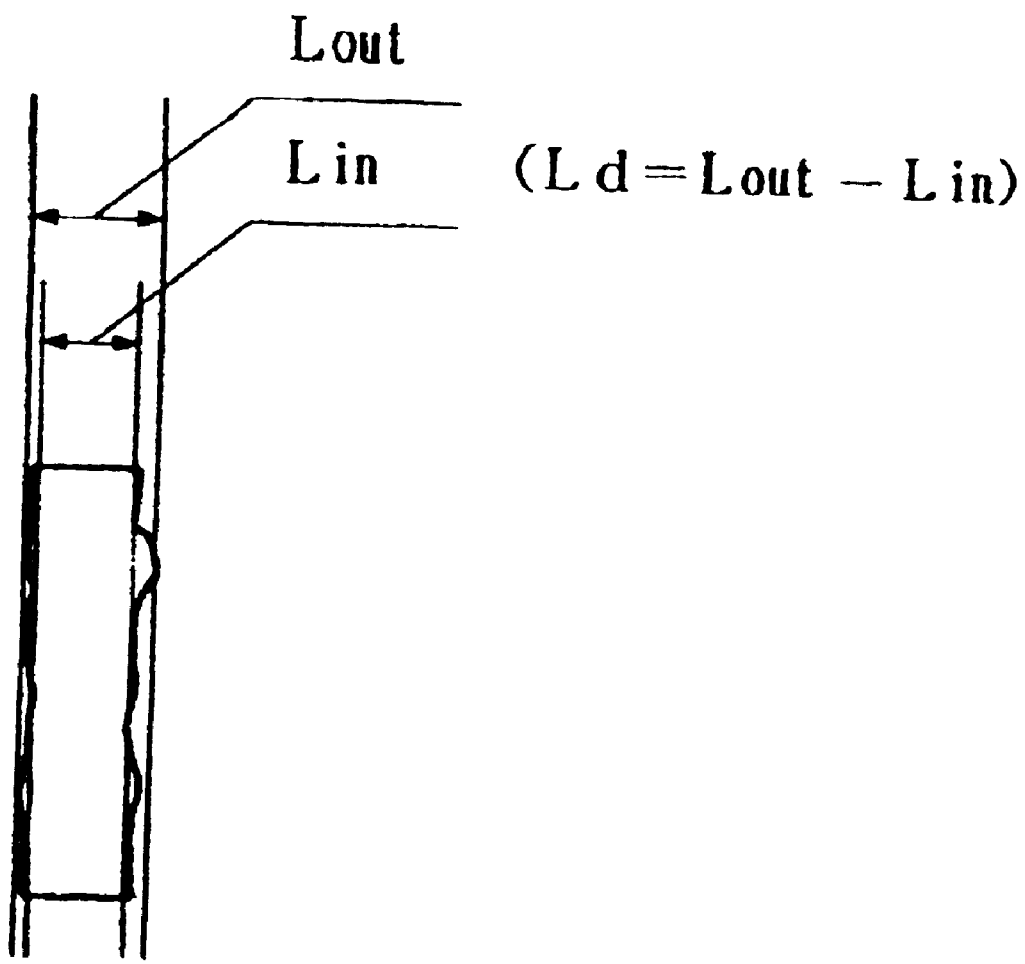
FIG. 1 is a cross sectional view showing a method of evaluating surface roughness of an isolated line pattern.

The present invention will be described in detail below.
Component (A)

The component (A) of the present invention is an aromatic sulfonic acid onium salt compound shown by the above formula (1) (hereinafter called "onium salt compound (A)"). The component (A) acts as a photoacid generator (hereinafter abbreviated as "acid generator") in the radiation-sensitive resin composition of the present invention.

In the formula (1), as examples of an onium cation of sulfur or iodine represented by $Z^+$, onium cations shown by the following formula (5) and (6) can be given:

(5)

wherein $R^{10}$ to $R^{12}$ individually represent a substituted or unsubstituted alkyl group having 1–16 carbon atoms (including the carbon number of the substituent, hereinafter the same) or a substituted or unsubstituted aryl group having 6–22 carbon atoms, provided that at least one of $R^{10}$ to $R^{12}$ represents the aryl group, or at least two of $R^{10}$ to $R^{12}$ bond to form a ring with a sulfur atom, with the remainder being the alkyl group or aryl group, provided that an aromatic ring is included in the formula;

(6)

wherein $R^{13}$ and $R^{14}$ individually represent a substituted or unsubstituted aryl group having 6–22 carbon atoms, or $R^{13}$ and $R^{14}$ bond to form a ring with the iodine atom, provided that an aromatic ring is included in the formula.

In the formula (5), the ring formed by at least two of $R^{10}$ to $R^{12}$ and the sulfur atom may be either an aromatic ring or non-aromatic ring, which may further include a hetero atom other than the sulfur atom such as an oxygen atom, sulfur atom, or nitrogen atom, provided that, when at least two of $R^{10}$ to $R^{12}$ bond to form a nonaromatic ring with the sulfur atom, an aromatic ring must be included in the formula.

In the formula (6), the ring formed by $R^{13}$ and $R^{14}$ with the iodine atom may be either an aromatic ring or non-aromatic ring, which may further include a hetero atom other than the iodine atom such as an oxygen atom, sulfur atom, or nitrogen atom, provided that, when $R^{13}$ and $R^{14}$ bond to form a nonaromatic ring with the iodine atom, an aromatic ring must be included in the formula.

As preferable specific examples of $Z^+$, groups shown by the following formulas (5-1) to (5-30) and (6-1) to (6-10) can be given.

(5-1) 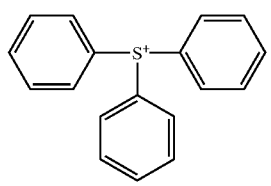
(5-2) 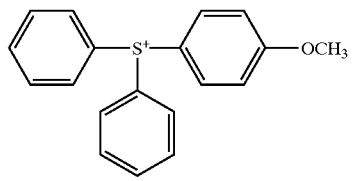
(5-3) 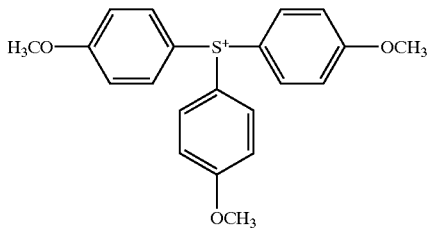
(5-4) 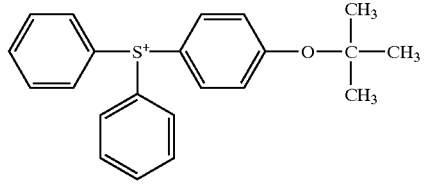
(5-5) 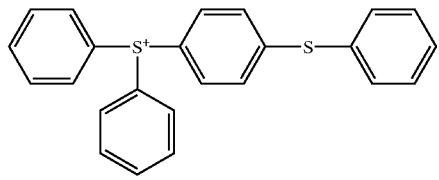
(5-6) 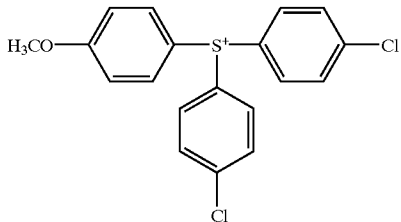
(5-7) 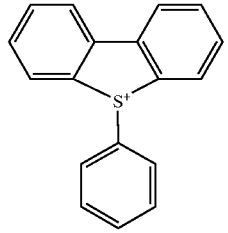
(5-8) 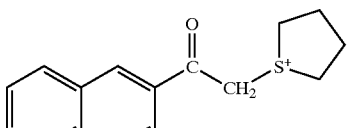
(5-9) 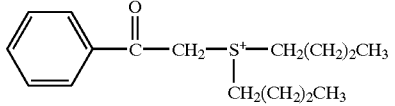
(5-10) 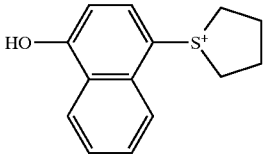
(5-11) 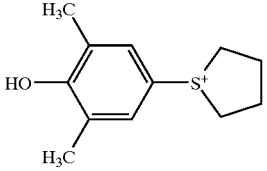
(5-12) 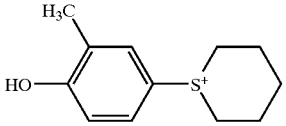
(5-13) 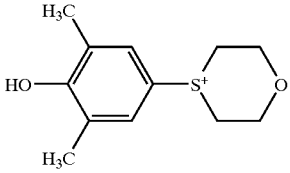
(5-14) 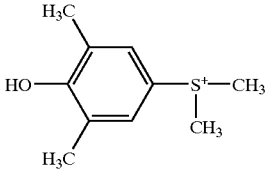
(5-15) 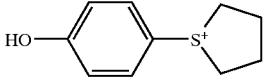
(5-16) 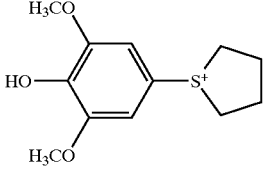
(5-17) 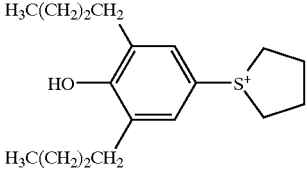

(5-18) 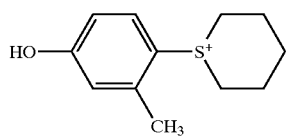
(5-19) 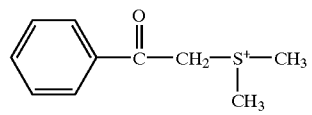
(5-20) 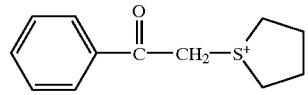
(5-21) 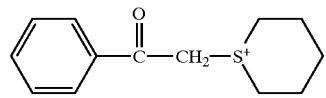
(5-22) 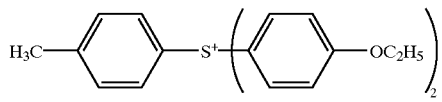
(5-23) 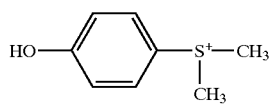
(5-24) 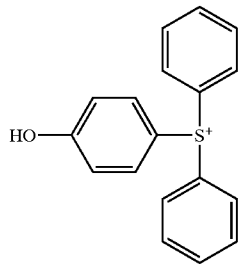
(5-25) 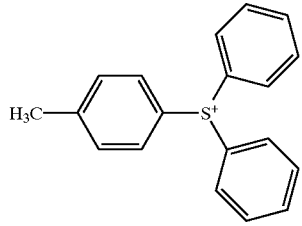
(5-26) 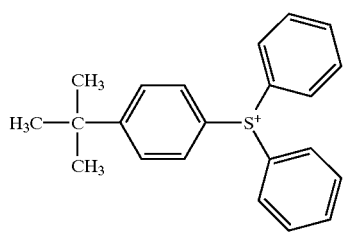
(5-27) 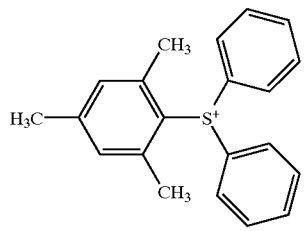
(5-28) 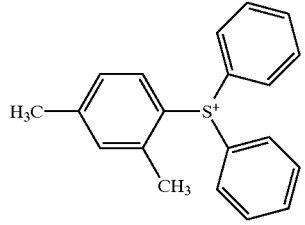
(5-29) 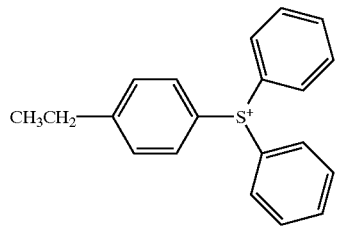
(5-30) 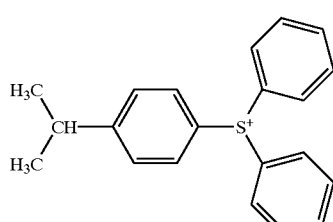
(6-1) 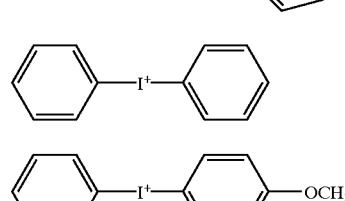
(6-2) 
(6-3) 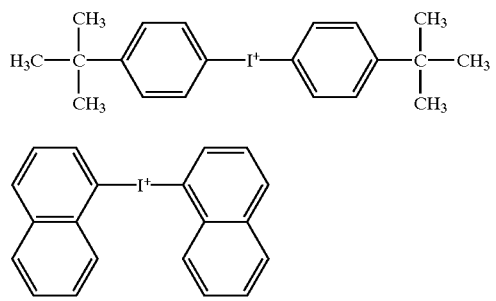
(6-4) 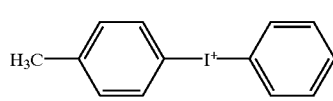
(6-5) 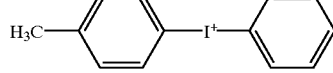

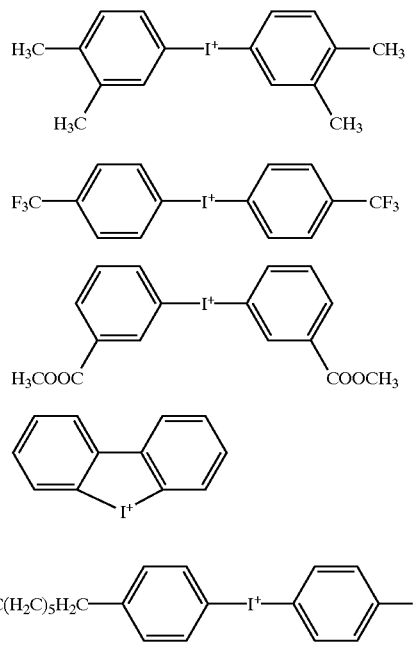

Of these, compounds shown by the formulas (5-1), (5-2), (5-3), (5-4), (5-5), (5-24), (6-3), (6-4) and the like are preferable.

The onium salt compound (A) is synthesized by, for example, a salt exchange reaction of a sodium salt or ammonium salt of corresponding sulfonic acid with a corresponding onium chloride or onium hydroxide using a conventional method.

Component (B)

The component (B) of the present invention comprises either one or both of a copolymer (I) which comprises a recurring unit shown by the above formula (2) (hereinafter called "recurring unit (2)") and a recurring unit shown by the above formula (3) (hereinafter called "recurring unit (3)") and a copolymer (II) which comprises the recurring unit (2) and a recurring unit shown by the above formula (4) (hereinafter called "recurring unit (4)").

In the recurring unit (2) in the copolymers (I) and (II), recurring unit (3) in the copolymer (I), and recurring unit (4) in the copolymer (II), as examples of a halogen atom represented by $R^2$, $R^5$, and $R^9$, a fluorine atom, chlorine atom, and the like can be given.

As examples of an organic group having 1–6 carbon atoms represented by $R^2$, $R^5$, and $R^9$, an alkyl group such as a methyl group, ethyl group, n-propyl group, i-propyl group, n-butyl group, and t-butyl group, an alkoxyl group such as a methoxy group, ethoxy group, n-propoxy group, i-propoxy group, and n-butoxy group, and the like can be given.

As $R^2$, $R^5$, and $R^9$ in the recurring unit (2) in the copolymers (I) and (II), recurring unit (3) in the copolymer (I), and recurring unit (4) in the copolymer (II), a methyl group is particularly preferable.

As i, j, and k in the recurring unit (2) in the copolymers (I) and (II), recurring unit (3) in the copolymer (I), and recurring unit (4) in the copolymer (II), either 0 or 1 is preferable.

As examples of preferable monomers which provide the recurring unit (2) in the copolymers (I) and (II), 4-hydroxystyrene, 3-hydroxystyrene, 2-hydroxystyrene, 4-hydroxy-α-methylstyrene, 3-hydroxy-α-methylstyrene, 2-hydroxy-α-methylstyrene, 3-methyl-4-hydroxystyrene, 3-methyl-4-hydroxy-α-methylstyrene, and the like can be given.

Of these monomers, 4-hydroxystyrene, 3-hydroxystyrene, and 4-hydroxy-α-methylstyrene are particularly preferable.

The monomers which provide the recurring unit (2) may be used either individually or in combination of two or more.

In the copolymer (I), as examples of a tertiary alkyl group having 4–10 carbon atoms represented by $R^4$ in the recurring unit (3), a t-butyl group, 1,1-dimethylpropyl group, 1-methyl-1-ethylpropyl group, 1,1-dimethylbutyl group, 1,1-dimethylpentyl group, 1-methyl-1-ethylpentyl group, 1,1-dimethylhexyl group, 1,1-dimethylheptyl group, 1,1-dimethyloctyl group, and the like can be given.

Of these tertiary alkyl groups, a t-butyl group is particularly preferable.

A group "—O—$R^4$" in the recurring unit (3) is acid-dissociable.

As examples of preferable monomers which provide the recurring unit (3), 4-t-butoxystyrene, 3-t-butoxystyrene, 2-t-butoxystyrene, 4-t-butoxy-α-methylstyrene, 3-t-butoxy-α-methylstyrene, 2-t-butoxy-α-methylstyrene, 3-methyl-4-t-butoxystyrene, 3-methyl-4-t-butoxy-α-methylstyrene, 4-(1',1'-dimethylpropoxy)styrene, 4-(1',1'-dimethylpropoxy)-α-methylstyrene, and the like can be given.

Of these monomers, 4-t-butoxystyrene, 3-t-butoxystyrene, 4-t-butoxy-α-methylstyrene are preferable, with 4-t-butoxystyrene being particularly preferable.

The monomers which provide the recurring unit (3) may be used either individually or in combination of two or more.

The content of the recurring unit (2) in the copolymer (I) is 20–90 mol %, preferably 30–85 mol %, and still more preferably 40–80 mol % of the total amount of the recurring units. If the content of the recurring unit (2) is less than 20 mol %, resolution as a resist tends to decrease. If the content exceeds 90 mol %, the resulting pattern shape may be impaired.

The content of the recurring unit (3) is 10–50 mol %, preferably 15–45 mol %, and still more preferably 15–40 mol % of the total amount of the recurring units. If the content of the recurring unit (3) is less than 10 mol %, resolution as a resist tends to decrease. If the content exceeds 50 mol %, adhesion of the fine pattern tends to decrease.

As examples of a linear, branched, or cyclic alkyl group having 1–6 carbon atoms represented by $R^7$ and $R^8$ in the copolymer (II), a methyl group, ethyl group, n-propyl group, i-propyl group, n-butyl group, i-butyl group, sec-butyl group, t-butyl group, n-pentyl group, n-hexyl group, cyclopentyl group, cyclohexyl group, and the like can be given.

As $R^7$ in the recurring unit (4), a hydrogen atom, a methyl group, ethyl group, and cyclohexyl group are preferable. As $R^8$, a methyl group, ethyl group, and cyclohexyl group are preferable.

An acetal group shown by the following formula (7) in the recurring unit (4) (hereinafter called "acetal group (7)") is acid-dissociable:

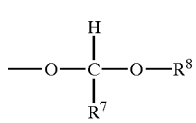

(7)

wherein $R^7$ and $R^8$ are the same as defined for the above formula (4).

As examples of the acetal group (7), a methoxymethoxy group, ethoxymethoxy group, n-propoxymethoxy group, i-propoxymethoxy group, n-butoxymethoxy group, t-butoxymethoxy group, n-pentyloxymethoxy group, n-hexyloxymethoxy group, cyclopentyloxymethoxy group, cyclohexyloxymethoxy group, 1-methoxyethoxy group, 1-ethoxyethoxy group, 1-n-propoxyethoxy group, 1-i-propoxyethoxy group, 1-n-butoxyethoxy group, 1-t-butoxyethoxy group, 1-n-pentyloxyethoxy group, 1-n-hexyloxyethoxy group, 1-cyclopentyloxyethoxy group, 1-cyclohexyloxyethoxy group, (cyclohexyl)(methoxy)methoxy group, (cyclohexyl)(ethoxy)methoxy group, (cyclohexyl)(n-propoxy)methoxy group, (cyclohexyl)(i-propoxy)methoxy group, (cyclohexyl)(cyclohexyloxy)methoxy group, and the like can be given.

Of these acetal groups (7), a 1-methoxyethoxy group, 1-ethoxyethoxy group, and 1-cyclohexyloxyethoxy group are preferable.

As examples of preferable monomers which provide the recurring unit (4), 4-methoxymethoxystyrene, 3-methoxymethoxystyrene, 2-methoxymethoxystyrene, 3-methyl-4-methoxymethoxystyrene, 4-methoxymethoxy-α-methylstyrene, 3-methoxymethoxy-α-methylstyrene, 2-methoxymethoxy-α-methylstyrene, 3-methyl-4-methoxymethoxy-α-methylstyrene, 4-ethoxymethoxystyrene, 3-ethoxymethoxystyrene, 2-ethoxymethoxystyrene, 3-methyl-4-ethoxymethoxystyrene, 4-ethoxymethoxy-α-methylstyrene, 3-ethoxymethoxy-α-methylstyrene, 2-ethoxymethoxy-α-methylstyrene, 3-methyl-4-ethoxymethoxy-α-methylstyrene, 4-cyclohexyloxymethoxystyrene, 4-cyclohexyloxymethoxy-α-methylstyrene, 4-(1'-methoxyethoxy)styrene, 3-(1'-methoxyethoxy)styrene, 2-(1'-methoxyethoxy)styrene, 3-methyl-4-(1'-methoxyethoxy)styrene, 4-(1'-methoxyethoxy)-α-methylstyrene, 3-(1'-methoxyethoxy)-α-methylstyrene, 2-(1'-methoxyethoxy)-α-methylstyrene, 3-methyl-4-(1'-methoxyethoxy)-α-methylstyrene, 4-(1'-ethoxyethoxy)styrene, 3-(1'-ethoxyethoxy)styrene, 2-(1'-ethoxyethoxy)styrene, 3-methyl-4-(1'-ethoxyethoxy)styrene, 4-(1'-ethoxyethoxy)-α-methylstyrene, 3-(1'-ethoxyethoxy)-α-methylstyrene, 2-(1'-ethoxyethoxy)-α-methylstyrene, 3-methyl-4-(1'-ethoxyethoxy)-α-methylstyrene, 4-(1'-cyclohexyloxyethoxy)styrene, 4-(1'-cyclohexyloxyethoxy)-α-methylstyrene, and the like can be given.

Of these monomers, 4-(1'-methoxyethoxy)styrene, 4-(1'-ethoxyethoxy)styrene, and 4-(1'-cyclohexyloxyethoxy)styrene are preferable, with 4-(1'-ethoxyethoxy)styrene, and 4-(1'-cyclohexyloxyethoxy)styrene being particularly preferable.

The content of the recurring unit (2) in the copolymer (II) is 10–95 mol %, preferably 40–95 mol %, and still more preferably 50–90 mol % of the total amount of the recurring units. If the content of the recurring unit (2) is less than 10 mol %, adhesion to substrates as a resist tends to decrease. If the content exceeds 95 mol %, an unexposed area tends to be easily dissolved, whereby formation of the pattern shape may become difficult or the pattern shape may be impaired.

The content of the recurring unit (4) is 5–70 mol %, preferably 5–60 mol %, and still more preferably 10–50 mol % of the total amount of the recurring units. If the content of the recurring unit (4) is less than 5 mol %, resolution as a resist tends to decrease. If the content exceeds 70 mol %, heat resistance tends to decrease.

The copolymer (II) may further comprise the recurring unit (3), as required. The total content of the recurring units (3) and (4) in the copolymer (II) is 10–70 mol %, preferably 15–60 mol %, and still more preferably 20–50 mol % of the total amount of the recurring units. If the content of the recurring units (3) and (4) is less than 10 mol %, resolution as a resist tends to decrease. If the content exceeds 70 mol %, adhesion to substrates or heat resistance tends to decrease. There are no specific limitations to the ratio of the recurring unit (3) to the recurring unit (4) in the copolymer (II).

The copolymers (I) and (II) may further comprise recurring units other than the above recurring units (hereinafter called "other recurring units"), as required.

As examples of monomers which provide the other recurring units, monofunctional monomers having one polymerizable unsaturated bond such as aromatic vinyl compounds such as styrene, α-methylstyrene, 4-methoxystyrene, 3-methoxystyrene, 2-methoxystyrene, 4-methoxy-α-methylstyrene, 3-methoxy-α-methylstyrene, 2-methoxy-α-methylstyrene, 4-acetoxystyrene, 3-acetoxystyrene, 2-acetoxystyrene, 4-acetoxy-α-methylstyrene, 3-acetoxy-α-methylstyrene, 2-acetoxy-α-methylstyrene, 3-methyl-4-acetoxystyrene, and 3-methyl-4-acetoxy-α-methylstyrene; unsaturated carboxylic acids such as acrylic acid, methacrylic acid, and maleic anhydride or acid anhydrides of these unsaturated carboxylic acids; esters such as methyl ester, ethyl ester, 2-hydroxyethyl ester, 2-hydroxypropyl ester, benzyl ester, isobornyl ester, 1-adamantyl ester, and tricyclodecanyl ester of the above unsaturated carboxylic acids; unsaturated nitriles such as acrylonitrile, methacrylonitrile, and vinylidene cyanide; unsaturated amides such as acrylamide, N,N-dimethylacrylamide, methacrylamide, N,N-dimethylmethacrylamide; and unsaturated imides such as maleimide, N-cyclohexylmaleimide, and N-phenylmaleimide; and the like can be given.

Of these other monofunctional monomers, styrene, 4-methoxystyrene, 4-acetoxystyrene, isobornyl acrylate, tricyclodecanyl acrylate, and the like are preferable.

These other monofunctional monomers may be used either individually or in combination of two or more.

In the copolymers (I) and (II), the content of the recurring units derived from the other monofunctional monomers is usually 70 mol % or less, preferably 50 mol % or less, and still more preferably 40 mol % or less of the total amount of the recurring units (2) and (3) or the recurring units (2) and (4).

A branched structure may be introduced into the copolymers (I) and (II) using a polyfunctional monomer having two polymerizable unsaturated bonds, as required.

As examples of such a polyfunctional monomer, polyfunctional acrylates or polyfunctional methacrylates disclosed in Japanese Patent Application Laid-open No. 316888/1996, polyfunctional aromatic vinyl compounds such as divinylbenzene and diisopropenylbenzene, and the like can be given.

The above polyfunctional monomer may be used either individually or in combination of two or more.

When using diacrylate or dimethacrylate of 1,1-dimethyl ethylene glycol as the polyfunctional monomer, for example, an acid-dissociable branched structure shown by the following formula (8) may be introduced into the copolymers (I) and (II).

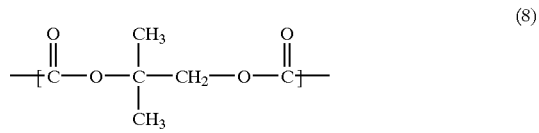

(8)

A branched structure formed by an acetal cross-linking group may be introduced into the copolymers (I) and (II) by reacting a phenolic hydroxyl group in the copolymers and a divinyl ether compound.

As examples a divinyl ether compound which provides such a branched structure, ethylene glycol divinyl ether, diethylene glycol divinyl ether, cyclohexane-1,4-dimethanol divinyl ether, and the like can be given.

As specific examples of the branched structure formed by an acetal cross-linking group, an acid-dissociable branched structure shown by the following formula (9) can be given:

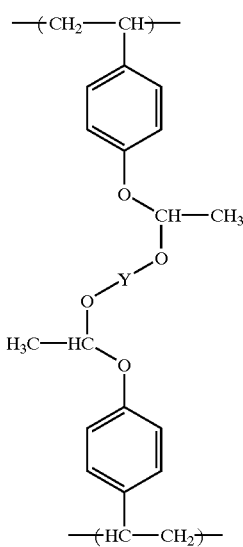

(9)

wherein Y represents a divalent organic group such as an ethylene group, diethylene group, and 1,4-cyclohexylene group.

In the copolymers (I) and (II), the content of either one or both of the recurring unit having a branched structure formed by the polyfunctional monomer and the recurring unit having a branched structure formed by the acetal cross-linking group is preferably 10 mol % or less of the total amount of the recurring units (2) and (3) or the recurring units (2) and (4).

The polystyrene-reduced weight average molecular weight (hereinafter referred to as "Mw") of the copolymer (I) having no branched structure determined by gel permeation chromatography (hereinafter referred to as "GPC") is 1,000–100,000, preferably 3,000–50,000, and still more preferably 3,000–40,000. If Mw of the copolymer (I) is less than 1,000, sensitivity and heat resistance as a resist tend to decrease. If Mw exceeds 100,000, solubility in a developer tends to decrease.

In the copolymer (I) having no branched structure, the ratio of Mw to Mn (polystyrene-reduced number average molecular weight determined by GPC) (Mw/Mn) is 1.0–3.0, and preferably 1.0–2.5.

Mw of the copolymer (I) having a branched structure is 5,000–500,000, preferably 7,000–300,000, and still more preferably 10,000–150,000. If Mw of the copolymer (I) is less than 5,000, resolution as a resist tends to decrease. If Mw exceeds 500,000, coatability may be impaired.

Mw/Mn of the copolymer (I) having a branched structure is 1.5–10.0, and preferably 2.0–5.0.

The copolymer (I) is prepared using the following methods, for example.

(a) A method of copolymerizing hydroxystyrenes corresponding to the recurring unit (2) and hydroxystyrene derivatives corresponding to the recurring unit (3), optionally together with other monofunctional or polyfunctional monomers.

(b) A method of (co)polymerizing hydroxystyrene derivatives corresponding to the recurring unit (3) optionally together with other monofunctional or polyfunctional monomers, and then partially hydrolyzing and/or solvolyzing the tertiary alkoxyl group in the (co)polymer using a basic catalyst.

(c) A method of copolymerizing hydroxystyrenes in which a phenolic hydroxyl group is blocked by an appropriate blocking group such as a silyl group, and hydroxystyrene derivatives corresponding to the recurring unit (3), optionally together with other monofunctional or polyfunctional monomers, and then selectively removing the blocking group.

(d) A method of introducing a branched structure formed by an acetal cross-linking group into the copolymers (I) obtained using the methods (a) to (c) using a divinyl ether compound.

Copolymerization in the method (a) is carried out by block polymerization, solution polymerization, precipitation polymerization, emulsion polymerization, suspension polymerization, block-suspension polymerization, and the like using an appropriate radical polymerization initiator.

Copolymerization in the methods (b) and (c) is carried out using the same polymerization methods as in the method (a), anionic polymerization, and the like.

Mw of the copolymer (II) having no branched structure is 1,000–150,000, preferably 3,000–100,000, and still more preferably 3,000–50,000. If Mw of the copolymer (II) is less than 1,000, sensitivity and heat resistance as a resist tend to decrease. If Mw exceeds 150,000, solubility in a developer tends to decrease.

Mw/Mn of the copolymer (II) having no branched structure is 1.0–3.0, and preferably 1.0–2.5.

Mw of the copolymer (II) having a branched structure is 8,000–500,000, preferably 12,000–300,000, and still more preferably 12,000–150,000. If Mw of the copolymer (II) is less than 8,000, resolution as a resist tends to decrease. If Mw exceeds 500,000, coatability may be impaired.

Mw/Mn of the copolymer (II) having a branched structure is 1.5–10.0, and preferably 2.0–5.0.

The copolymer (II) is prepared by the following methods, for example.

(e) A method of (co)polymerizing hydroxystyrenes optionally together with other monofunctional or polyfunctional monomers, and then replacing part of hydrogen atoms of aphenolic hydroxyl group in the (co)polymer by the acetal group (7).

(f) A method of copolymerizing hydroxystyrene derivatives in which a hydrogen atom of a phenolic hydroxyl group is replaced by the acetal group (7) and hydroxystyrenes, optionally together with other monofunctional or polyfunctional monomers.

Copolymerization in the methods (e) and (f) is carried out using the same polymerization methods as in the method (a).

A branched structure formed by an acetal cross-linking group is introduced into the copolymer (II) by, for example, causing an appropriate amount of a divinyl ether compound to react together when introducing the acetal group (7) in the method (e).

In the present invention, each of the copolymers (I) and (II) may be used either individually or in combination of two or more.

Other Resins Containing Acid-dissociable Group

The radiation-sensitive resin composition of the present invention may further comprise resins containing an acid-dissociable group other than the copolymers (I) and (II) (hereinafter called "other acid-dissociable group-containing resins").

Such other acid-dissociable group-containing resins are resins insoluble or scarcely soluble in alkali which are blocked by an acid-dissociable group and become alkali-soluble when the acid-dissociable group dissociates. The term "insoluble or scarcely soluble in alkali" used herein refers to the characteristics of a resin, in which 50% or more of the initial thickness of the resin coating remains after development under the same alkaline development conditions as those employed to form a resist pattern from the radiation-sensitive resin composition comprising other acid-dissociable group-containing resins.

As examples of other acid-dissociable group-containing resins, resins insoluble or scarcely soluble in alkali which have a structure in which a hydrogen atom of an acidic functional group in an alkali-soluble resin having one or more acidic functional groups such as a phenolic hydroxyl group and a carboxyl group (alkali-soluble resin having one or more recurring units shown by the following formulas (10) to (13)) is replaced by one or more acid-dissociable groups which dissociate in the presence of an acid (hereinafter called "acid-dissociable group (i)") (such a resin is hereinafter called "resin (b)") can be given.

(10)

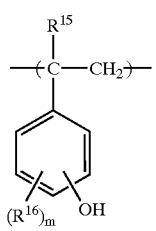

wherein $R^{15}$ represents a hydrogen atom or a methyl group, $R^{16}$s individually represent a halogen atom or a monovalent organic group having 1–6 carbon atoms, and m is an integer from 0 to 3;

(11)

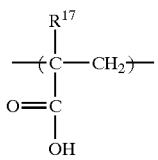

wherein $R^{17}$ represents a hydrogen atom or a methyl group;

(12)

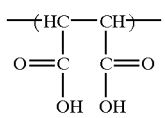

(13)

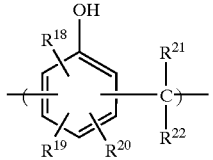

wherein $R^{18}$ to $R^{22}$ individually represent a hydrogen atom or a linear or branched alkyl group having 1–4 carbon atoms.

The acid-dissociable group (i) defined above excludes a tertiary alkyl group and the acetal group (7) when replacing a hydrogen atom of a phenolic hydroxyl group in the (co)polymer of hydroxystyrenes or hydroxy-α-methylstyrenes.

As examples of the acid-dissociable group (i) in the resin (b), a substituted methyl group, 1-substituted ethyl group, 1-substituted propyl group, 1-branched alkyl group, silyl group, germyl group, alkoxycarbonyl group, acyl group, cyclic acid-dissociable group, and the like can be given.

As examples of a substituted methyl group, a methoxymethyl group, methylthiomethyl group, ethoxymethyl group, ethylthiomethyl group, (2-methoxyethoxy)methyl group, benzyloxymethyl group, benzylthiomethyl group, phenacyl group, 4-bromophenacyl group, 4-methoxyphenacyl group, 4-methylthiophenacyl group, ?-methylphenacyl group, cyclopropylmethyl group, benzyl group, diphenylmethyl group, triphenylmethyl group, 4-bromobenzyl group, 4-nitrobenzyl group, 2-methoxybenzyl group, 3-methoxybenzyl group, 4-methoxybenzyl group, 2-methylthiobenzyl group, 3-methyithiobenzyl group, 4-methylthiobenzyl group, 4-ethoxybenzyl group, 4-ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, and the like can be given.

As examples of a 1-substituted methyl group, a 1-methoxyethyl group, 1-methylthioethyl group, 1,1-dimethoxyethyl group, 1-ethoxyethyl group, 1-ethylthioethyl group, 1,1-diethoxyethyl group, 1-n-propoxyethyl group, 1-cyclohexyloxyethyl group, 1-cyclohexylthioethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-cyclohexylethyl group, 1-phenylethyl group, 1,1-diphenylethyl group, 1-methoxycarbonylethyl group, 1-ethoxycarbonylethyl group, 1-n-propoxycarbonylethyl group, 1-i-propoxycarbonylethyl group, 1-n-butoxycarbonylethyl group, 1-t-butoxycarbonylethyl group, and the like can be given.

As examples of a 1-branched alkyl group, an i-propyl group, sec-butyl group, t-butyl group, 1,1-dimethylpropyl group, 1-methylbutyl group, 1,1-dimethylbutyl group, and the like can be given.

As examples of a 1-substituted propyl group, a 1-methoxypropyl group, 1-ethoxypropyl group, and the like can be given.

As examples of a silyl group, a trimethylsilyl group, ethyldimethylsilyl group, methyldiethylsilyl group, triethylsilyl group, i-propyldimethylsilyl group, methyldi-i-propyl silyl group, tri-i-propylsilyl group, t-butyldimethylsilyl group, methyldi-t-butylsilyl group, tri-t-butylsilyl group, phenyldimethylsilyl group, methyldiphenylsilyl group, triphenylsilyl group, and the like can be given.

As examples of a germyl group, a trimethylgermyl group, ethyldimethylgermyl group, methyldiethylgermyl group, triethylgermyl group, i-propyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, triphenylgermyl group, and the like can be given.

As examples of an alkoxycarbonyl group, a methoxycarbonyl group, ethoxycarbonyl group, i-propoxycarbonyl group, t-butoxycarbonyl group, and the like can be given.

As examples of an acyl group, an acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, scucinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, and the like can be given.

As examples of a cyclic acid-dissociable group, a cyclopropyl group, cyclopentyl group, cyclohexyl group, cyclohexenyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, 3-tetrahydrothiophene-1,1-dioxide group, and the like can be given.

Of these acid-dissociable groups, a methoxymethyl group, t-butoxycarbonylmethyl group, 1-methoxyethyl group, 1-ethoxyethyl group, 1-n-propoxyethyl group, 1-cyclohexyloxyethyl group, t-butyl group, 1-ethoxypropyl group, trimethylsilyl group, t-butoxycarbonyl group, tetrahydropyranyl group, tetrahydrofuranyl group, and the like are preferable.

The percentage of the acid-dissociable group (i) introduced into the resin (b) (percentage of the number of acid-dissociable groups (i) among the total number of acidic functional groups and acid-dissociable groups (i) in the resin (b)) is preferably 10–100%, and still more preferably 15–100%, although the percentage varies depending on types of acid-dissociable group (i) and the alkali-soluble resin into which the acid-dissociable group (i) is introduced.

Mw of the resin (b) is 1,000–150,000, and preferably 3,000–100,000.

Mw/Mn of the resin (b) is 1.0–3.0, and preferably 1.0–2.5.

The resin (b) is prepared using a method of introducing one or more acid-dissociable groups (i) into an alkali-soluble resin prepared in advance; a method of (co)polymerizing one or more monomers having the acid-dissociable group (i); a method of (co)polycondensing one or more polycondensed components having the acid-dissociable group (i); or the like.

In the present invention, the resin (b) may be used either individually or in combination of two or more.

Additives

Additives such as acid generators other than the acid generator (A) (hereinafter called "other acid generators"), acid diffusion controllers, surfactants, and sensitizers may be optionally added to the radiation-sensitive resin composition of the present invention.

As examples of other acid generators, (1) onium salts, (2) sulfone compounds, (3) sulfonate compounds, (4) sulfonimide compounds, (5) diazomethane compounds, (6) disulfonylmethane compound, and the like can be given.

Examples of these acid generators will be given below.
(1) Onium Salts

As examples of onium salts, iodonium salt, sulfonium salt, phosphonium salt, diazonium salt, ammonium salt, pyridinium salt, and the like can be given.

Specific examples of onium salts include:

bis(4-t-butylphenyl)iodonium nonafluoro-n-butanesufonate,
bis(4-t-butylphenyl)iodonium trifluoromethanesulfonate,
bis(4-t-butylphenyl)iodonium pyrenesulfonate,
bis(4-t-butylphenyl)iodonium n-dodecylbenzenesulfonate,
bis(4-t-butylphenyl)iodonium p-toluenesulfonate,
bis(4-t-butylphenyl)iodonium benzenesulfonate,
bis (4-t-butylphenyl)iodonium 10-camphorsulfonate,
bis(4-t-butylphenyl)iodonium n-octanesulfonate,
bis(4-t-butylphenyl)iodonium 2-trifluoromethylbenzenesulfonate,
diphenyliodonium nonafluoro-n-butanesufonate,
diphenyliodonium trifluoromethanesulfonate,
diphenyliodonium pyrenesulfonate,
diphenyliodonium n-dodecylbenzenesulfonate,
diphenyliodonium p-toluenesulfonate,
diphenyliodonium benzenesulfonate,
diphenyliodonium 10-camphorsulfonate,
diphenyliodonium n-octanesulfonate,
diphenyliodonium 2-trifluoromethylbenzenesulfonate,
triphenylsulfonium nonafluoro-n-butanesufonate,
triphenylsulfonium trifluoromethanesulfonate,
triphenylsulfonium pyrenesulfonate,
triphenylsulfonium n-dodecylbenzenesulfonate,
triphenylsulfonium p-toluenesulfonate,
triphenylsulfonium benzenesulfonate,
triphenylsulfonium 10-camphorsulfonate,
triphenylsulfonium n-octanesulfonate,
triphenylsulfonium 2-trifluoromethylbenzenesulfonate,
triphenylsulfonium hexafluoroantimonate,
triphenylsulfonium naphthalenesulfonate,
4-t-butylphenyl.diphenylsulfonium nonafluoro-n-butanesufonate,
4-t-butylphenyl.diphenylsulfonium trifluoromethanesulfonate,
4-t-butylphenyl.diphenylsulfonium pyrenesulfonate,
4-t-butylphenyl.diphenylsulfonium n-dodecylbenzenesulfonate,
4-t-butylphenyl.diphenylsulfonium p-toluenesulfonate,
4-t-butylphenyl.diphenylsulfonium benzenesulfonate,
4-t-butylphenyl.diphenylsulfonium 10-camphorsulfonate,
4-t-butylphenyl.diphenylsulfonium n-octanesulfonate,
4-t-butylphenyl.diphenylsulfonium 2-trifluoromethylbenzenesulfonate,
4-t-butoxyphenyl.diphenylsulfonium nonafluoro-n-butanesufonate,
4-hydroxyphenyl.benzyl.methylsulfonium p-toluenesulfonate, and the like.
(2) Sulfone Compounds As examples of sulfone compounds, β-ketosulfone, β-sulfonylsulfone, and α-diazo compounds of these compounds, and the likes can be given.

As specific examples of sulfone compounds, phenacylphenylsulfone, mesitylphenacylsulfone, bis (phenylsulfonyl)methane, 4-trisphenacylsulfone, and the like can be given.
(3) Sulfonate Compounds As examples of sulfonate compounds, alkyl sulfonate, haloalkyl sulfonate, aryl sulfonate, imino sulfonate, and the like can be given.

As specific examples of sulfonate compounds, benzointosylate, pyrogallol tristrifluoromethanesulfonate, pyrogallol trisnonafluoro-n-butanesufonate, methanetrisulfonate of pyrogallol, nitrobenzyl-9,10-diethoxyanthracene-2-sulfonate, α-methylolbenzointosylate, α-methylolbenzoin n-octanesulfonate, α-methylolbenzoin trifluoromethanesulfonate, α-methylolbenzoin n-dodecylsulfonate, and the like can be given.

(4) Sulfonimide Compounds

As examples of sulfonimide compounds, compounds shown by the following formula (14) and the like can be given:

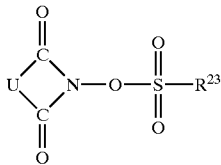
(14)

wherein U represents a divalent group such as an alkylene group, arylene group, and alkoxylene group, and $R^{23}$ represents a monovalent group such as an alkyl group, aryl group, halogenated alkyl group, and halogenated aryl group.

Specific examples of sulfonimide compounds include:

N-(trifluoromethylsulfonyloxy)succinimide,
N-(trifluoroethylsulfonyloxy)phthalimide,
N-(trifluoromethylsulfonyloxy)diphenylmaleimide,
N-(trifluoromethylsulfonyloxy)bicyclo[2.2.1]hept-5-ene-2, 3-dicarboxyimide,
N-(trifluoromethylsulfonyloxy)-7-oxabicyclo[2.2.1]hept-5-ene-2,3-dicarboxyimide,
N-(trifluoromethylsulfonyloxy)bicyclo[2.2.1]heptan-5,6-oxy-2,3-dicarboxyimide,
N-(trifluoromethylsulfonyloxy)naphthylimide,
N-(10-camphorsulfonyloxy)succinimide,
N-(10-camphorsulfonyloxy)phthalimide,
N-(10-camphorsulfonyloxy)diphenylmaleimide,
N-(10-camphorsulfonyloxy)bicyclo[2.2.1]hept-5-ene-2,3-dicarboxyimide,
N-(10-camphorsulfonyloxy)-7-oxabicyclo[2.2.1]hept-5-ene-2,3-dicarboxyimide,
N-(10-camphorsulfonyloxy)bicyclo[2.2.1]heptan-5,6-oxy-2,3-dicarboxyimide,
N-(10-camphorsulfonyloxy)naphthylimide,
N-(p-toluenesulfonyloxy)succinimide,
N-(p-toluenesulfonyloxy)phthalimide,
N-(p-toluenesulfonyloxy)diphenylmaleimide,
N-(p-toluenesulfonyloxy)bicyclo[2.2.1]hept-5-ene-2,3-dicarboxyimide,
N-(p-toluenesulfonyloxy)-7-oxabicyclo[2.2.1]hept-5-ene-2, 3-dicarboxyimide,
N-(p-toluenesulfonyloxy)bicyclo[2.2.1]heptane-5,6-oxy-2, 3-dicarboxyimide,
N-(p-toluenesulfonyloxy)naphthylimide,
N-(2-trifluoromethylbenzenesulfonyloxy)succinimide,
N-(2-trifluoromethylbenzenesulfonyloxy)phthalimide,
N-(2-trifluoromethylbenzenesulfonyloxy) diphenylmaleimide,
N-(2-trifluoromethylbenzenesulfonyloxy)bicyclo[2.2.1] hept-5-ene-2,3-dicarboxyimide,
N-(2-trifluoromethylbenzenesulfonyloxy)-7-oxabicyclo [2.2.1]hept-5-ene-2,3-dicarboxyimide,
N-(2-trifluoromethylbenzenesulfonyloxy)bicyclo[2.2.1] heptan-5,6-oxy-2,3-dicarboxyimide,
N-(2-trifluoromethylbenzenesulfonyloxy)naphthylimide,
N-(nonafluoro-n-butylsulfonyloxy)succinimide,
N-(nonafluoro-n-butylsulfonyloxy)phthalimide,
N-(nonafluoro-n-butylsulfonyloxy)diphenylmaleimide,
N-(nonafluoro-n-butylsulfonyloxy)bicyclo[2.2.1]hept-5-ene-2,3-dicarboxyimide,
N-(nonafluoro-n-butylsulfonyloxy)-7-oxabicyclo[2.2.1] hept-5-ene-2,3-dicarboxyimide,
N-(nonafluoro-n-butylsulfonyloxy)bicyclo[2.2.1]heptan-5, 6-oxy-2,3-dicarboxyimide,
N-(nonafluoro-n-butylsulfonyloxy) naphthylimide, and the like.

(5) Diazomethane Compounds

As examples of diazomethane compounds, a compound shown by the following formula (15) and the like can be given:

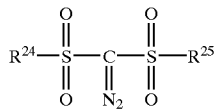
(15)

wherein $R^{24}$ and $R^{25}$ individually represent a monovalent group such as an alkyl group, aryl group, halogenated alkyl group, and halogenated aryl group.

As specific examples of diazomethane compounds, bis(trifluoromethylsulfonyl)diazomethane,
bis(cyclohexylsulfonyl)diazomethane,
bis(phenylsulfonyl)diazomethane,
bis(p-toluenesulfonyl)diazomethane,
methylsulfonyl.p-toluenesulfonyldiazomethane,
1-cyclohexylsulfonyl.1-(1,1-dimethylethylsulfonyl) diazomethane,
bis(1,1-dimethylethylsulfonyl)diazomethane,
bis(3,3-dimethyl-1,5-dioxaspiro[5.5]dodecane-8-sulfonyl) diazomethane,
bis(1,4-dioxaspiro[4.5]decane-7-sulfonyl)diazomethane, and the like can be given.

(6) Disulfonylmethane Compounds

As examples of disulfonylmethane compounds, a compound shown by the following formula (16) and the like can be given:

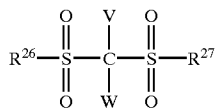
(16)

wherein $R^{26}$ and $R^{27}$ individually represent a linear or branched monovalent aliphatic hydrocarbon group, a cycloalkyl group, aryl group, aralkyl group, or other monovalent organic groups having a hetero atom, V and W individually represent an aryl group, a hydrogen atom, a linear or branched monovalent aliphatic hydrocarbon group, or other monovalent organic groups having a hetero atom, provided that at least one of V and W represents an aryl group, or V and W bond to form a monocyclic or polycyclic ring having at least one unsaturated bond, or V and W bond to form a group shown by the following formula (17);

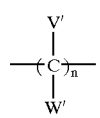
(17)

wherein V's and W's individually represent a hydrogen atom, halogen atom, an alkyl group, cycloalkyl group, aryl group, or aralkyl group, or V' and W' each bonded to the same or different carbon atoms bond to form a monocyclic carbon structure, and n is an integer from 2 to 10.

These other acid generators may be used either individually or in combination of two or more.

The proportion of other acid generators is appropriately determined depending on types of each acid generator. The proportion is 95 parts by weight or less, and preferably 90 parts by weight or less for 100 parts by weight of the acid generator (A) and other acid generators in total. If the proportion of other acid generators exceeds 95 parts by weight, the desired effects of the present invention may be impaired.

It is preferable to add an acid diffusion controller to the radiation-sensitive resin composition of the present invention. The acid diffusion controller controls diffusion of an acid generated from the acid generator (A) or other acid generators upon exposure in the resist coating to hinder undesired chemical reactions in the unexposed area.

The addition of the acid diffusion controller improves storage stability of the resulting radiation-sensitive resin composition and resolution as a resist. Moreover, the addition of the acid diffusion controller prevents the line width of the resist pattern from changing due to variation of post-exposure delay (PED) from exposure to development, whereby a composition with remarkably superior process stability can be obtained.

As the acid diffusion controller, organic compounds containing nitrogen of which the basicity does not change during exposure or heating for forming a resist pattern are preferable.

As examples of such nitrogen-containing organic compounds, compounds shown by the following formula (18) (hereinafter called "nitrogen-containing compound (α)"),

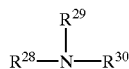

(18)

wherein $R^{28}$, $R^{29}$, and $R^{30}$ individually represent a hydrogen atom, a substituted or unsubstituted alkyl group, substituted or unsubstituted aryl group, or substituted or unsubstituted aralkyl group, diamino compounds having two nitrogen atoms in the molecule (hereinafter called "nitrogen-containing compounds (β)"), polyamino compounds having three or more nitrogen atoms in the molecule (hereinafter called "nitrogen-containing compounds (γ)"), compounds containing an amide group, urea compounds, heterocyclic compounds containing a nitrogen atom, and the like can be given.

Examples of the nitrogen-containing compounds (α) include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tricyclohexylamine; aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine; alkanolamines such as ethanolamine, diethanolamine, and triethanolamine; and the like.

Examples of the nitrogen-containing compounds (β) include ethylenediamine, N,N,N',N'-tetramethylenediamine, tetramethylenediamine, hexamethylenediamine, N,N,N',N'-tetrakis(2-hydroxyethyl)ethylenediamine, N,N,N',N'-tetrakis(2-hydroxypropyl)ethylenediamine, 4,4'-diaminodiphenylmethane, 4,4'-diamino diphenyl ether, 4,4'-diaminobenzophenone, 4,4'-diaminodiphenylamine, 2,2-bis(4'-aminophenyl)propane, 2-(3'-aminophenyl)-2-(4'-aminophenyl)propane, 2-(4'-aminophenyl)-2-(3'-hydroxyphenyl)propane, 2-(4'-aminophenyl)-2-(4'-hydroxyphenyl)propane, 1,4-bis[1'-(4"-aminophenyl)-1'-methylethyl]benzene, 1,3-bis[1'-(4"-aminophenyl)-1'-methylethyl]benzene, and the like.

Examples of the nitrogen-containing compounds (γ) include polyethyleneimine, polyallylamine, a polymer of dimethylaminoethylacrylamide, and the like.

Examples of compounds containing an amide group include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of urea compounds include urea, methylurea, 1,1-dimethylurea, 1,3-dimethylurea, 1,1,3,3-tetramethylurea, 1,3-diphenylurea, tributylthiourea, and the like.

Examples of nitrogen-containing heterocyclic compounds include imidazoles such as imidazole, benzimidazole, 2-methylimidazole, 4-methylimidazole, 2-phenylimidazole, 4-phenylimidazole, 4-methyl-2-phenylimidazole, and 2-phenylbenzimidazole, pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline, and acridine; pyrazine, pyrazole, pyridazine, quinoxaline, purine, pyrrolidine, piperidine, morpholine, 4-methylmorpholine, piperazine, 1,4-dimethylpiperazine, 1,4-diazabicyclo[2.2.2]octane, and the like.

Of these nitrogen-containing organic compounds, the nitrogen-containing compounds (α), nitrogen-containing compounds (β), nitrogen-containing compounds (γ), and nitrogen-containing heterocyclic compounds are preferable.

The acid diffusion controller may be used either individually or in combination of two or more.

The proportion of the aciddiffusion controller is 15 parts by weight or less, preferably 0.001–10 parts by weight, and still more preferably 0.005–5 parts by weight for 100 parts by weight of the copolymer (I) and/or copolymer (II) and other acid-dissociable group-containing resins in total. If the proportion of the acid diffusion controller exceeds 15 parts by weight, sensitivity as a resist and developability of the exposed area tend to decrease. If the proportion is less than 0.001 part by weight, the pattern shape or dimensional accuracy as a resist may decrease depending on processing conditions.

Surfactants improve coatability, striation, and developability of the radiation-sensitive resin composition. As surfactants, any of anionic-type surfactants, cationic-type surfactants, nonionic-type surfactants, and ampholytic-type surfactants may be used. Of these, nonionic-type surfactants are preferable.

As examples of nonionic-type surfactants, polyoxyethylene higher alkyl ethers, polyoxyethylene higher alkyl phenyl ethers, higher fatty acid diesters of polyethylene glycol, commercially available products such as KP (manufactured by Shin-Etsu Chemical Co., Ltd.), Polyflow (manufactured by Kyoeisha Chemical Co., Ltd.), EFTOP (manufactured by TOHKEM PRODUCTS CORPORATION), MEGAFAC (manufactured by Dainippon Ink and Chemicals, Inc.), Fluorad (manufactured by Sumitomo 3M, Ltd.), Asahi Guard, Surflon (manufactured by Asahi Glass Co., Ltd.), and the like can be given.

These surfactants may be used either individually or in combination of two or more.

The proportion of the surfactants to be added is 2 parts by weight or less, as an effective component, for 100 parts by weight of the total resin component in the radiation-sensitive resin composition.

Sensitizers absorb energy of radiation and transmit the energy to the acid generator (A) or other acid generators, thereby increasing the amount of an acid to be generated upon exposure. The sensitizers improve apparent sensitivity of the radiation-sensitive resin composition.

As examples of preferable sensitizers, acetophenones, benzophenones, naphthalenes, biacetyl, Eosine, Rose Bengale, pyrenes, anthracenes, phenothiazines, and the like can be given.

These sensitizers may be used either individually or in combination of two or more.

The proportion of the sensitizers to be added is 50 parts by weight or less, and preferably 30 parts by weight or less for 100 parts by weight of the total resin component in the radiation-sensitive resin composition.

The addition of dyes or pigments visualizes a latent image in the exposed area, thereby relaxing the effect of halation at the time of exposure. Use of adhesion improvers improves adhesion to substrates.

As other additives, low molecular weight alkali solubility controllers containing an alkali-soluble resin and/or acid dissociable blocking group, halation inhibitors, preservation stabilizers, antifoaming agents, form improvers, 4-hydroxy-4'-methylchalcone, and the like can be given.

Solvent

The radiation-sensitive resin composition of the present invention is prepared as a composition solution by dissolving the composition in a solvent so that the solid content is 2–50 wt %, for example, and filtering the composition using a filter with a pore diameter of about 0.2 $\mu$m.

As examples of solvents, ethers, esters, ether esters, ketones, ketone esters, amides, amide esters, lactams, lactones, (halogenated) hydrocarbons, and the like can be given. Specific examples include ethylene glycol monoalkyl ethers, diethylene glycol dialkyl ethers, propylene glycol monoalkyl ethers, propylene glycol dialkyl ethers, ethylene glycol monoalkyl ether acetates, propylene glycol monoalkyl ether acetates, acetates, hydroxyacetates, alkoxyacetates, acetoacetates, pyruvates, propionates, lactates, alkoxypropionate, butyrates, ketones, N,N-dialkylformamides, N,N-dialkylacetamides, N-alkylpyrrolidones, $\gamma$-lactones, (halogenated) aliphatic hydrocarbons, (halogenated) aromatic hydrocarbons, and the like.

Examples of specific compounds used as a solvent include ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether acetate, propylene glycol monoethyl ether acetate, propylene glycol mono-n-propyl ether acetate, ethyl acetate, n-propyl acetate, n-butyl acetate, isopropenyl acetate, 3-methoxybutyl acetate, 3-methyl-3-methoxybutyl acetate, hydroxyethyl acetate, ethoxyethyl acetate, methyl acetoacetoate, ethyl acetoacetate, isopropenyl propionate, 3-methyl-3-methoxybutyl propionate, methyl lactate, ethyl lactate, n-propyl lactate, i-propyl lactate, 3-methoxymethyl propionate, 3-methoxyethyl propionate, 3-ethoxymethyl propionate, 3-ethoxyethyl propionate, 2-hydroxy-2-methylethyl propionate, 3-methyl-3-methoxybutyl butyrate, 2-hydroxy-3-methylmethyl butyrate, methyl ethyl ketone, 2-heptanone, 3-heptanone, 4-heptanone, cyclohexanone, N-methylpyrrolidone, N,N-dimethylformamide, N,N-dimethylacetamide, toluene, xylene, and the like.

Of these solvents, propylene glycol monoalkyl ether acetates, lactates, 3-alkoxypropionates, ketones, and the like are preferable.

These solvents may be used either individually or in combination of two or more.

One or more solvents with a high boiling point maybe added to the solvent. Examples of such solvents with a high boiling point include benzyl ethyl ether, di-n-hexyl ether, diethylene glycol monomethyl ether, diethylene glycol monoethyl ether, acetonylacetone, isophorone, caproic acid, caprylic acid, 1-octanol, 1-nonanol, benzyl alcohol, benzyl acetate, ethyl benzoate, diethyl oxalate, diethyl maleate, $\gamma$-butyrolactone, ethylene carbonate, propylene carbonate, ethylene glycol monophenyl ether acetate, and the like.

Formation of Resist Pattern

When forming a resist pattern from the radiation-sensitive resin composition of the present invention, the composition solution prepared as described above is applied to a substrate such as a silicon wafer or a wafer coated with aluminum by rotational coating, cast coating, roll coating, or the like to form a resist coating. The resist coating is then pre-baked (hereinafter called "PB") and exposed through a specific mask pattern. As examples of radiation used for exposure, deep ultraviolet rays such as a bright line spectrum of a mercury lamp (wavelength: 254 nm), KrF excimer laser (wavelength: 248 nm), and ArF excimer laser (wavelength: 193 nm), X-rays such as synchrotron radiation, charged particle rays such as electron beams, and the like can be given. Of these, deep ultraviolet rays and charged particle rays are preferable, with a KrF excimer laser (wavelength: 248 nm), ArF excimer laser (wavelength: 193 nm), and electron beams being particularly preferable. The exposure conditions such as the dose of radiation are appropriately determined according to the composition of the radiation-sensitive resin composition, types of additives, and the like.

It is preferable to perform post exposure bake (hereinafter called "PEB") after exposure to improve apparent sensitivity of the resist. PEB is performed at a temperature of 30–200° C., and preferably 50–150° C., although the temperature varies depending on the composition of the radiation-sensitive resin composition, types of additives, and the like.

The resist coating is then developed in an alkaline developer to form a predetermined resist pattern.

As the alkaline developer, an alkaline aqueous solution in which one or more alkaline compounds such as an alkaline metal hydroxide, aqueous ammonia, alkylamines, alkanolamines, heterocyclic amines, tetraalkylammonium hydroxides, choline, 1,8-diazabicyclo[5.4.0]-7-undecene, and 1,5-diazabicyclo[4.3.0]-5-nonene are dissolved at a concentration of 1–10 wt %, and preferably 2–5 wt % is used. Of these, an aqueous solution of tetraalkylammonium hydroxides is particularly preferable.

An appropriate amount of a water-soluble organic solvent such as methanol and ethanol, surfactants, and the like may be added to a developer consisting of an alkaline aqueous solution.

When using a developer consisting of an alkaline aqueous solution, the resist coating is generally washed with water after development.

EXAMPLES

The embodiments of the present invention will be described in more detail by examples. However, these examples should not be construed as limiting the present invention.

Measurement of Mw and Mn and evaluation of resists were carried out as follows.

Mw and Mn

Mw and Mn were measured by GPC using GPC columns (manufactured by Tosoh Corp., G2000H$^{XL}$×2, G3000H$^{XL}$×1, G4000H$^{XL}$×1) at a flow rate of 1.0 ml/min. and a column temperature of 40° C. using tetrahydrofuran as an eluate and monodispersed polystyrene as a standard.

Resolution (1L1S)

Minimum dimensions of line-and-space patterns (1L1S) resolved at an optimum dose, at which a one to one 1L1S with a line width of 0.20 μm was formed, was taken as a standard for resolution.

Resolution (1L5S)

Resolution at which the line width of isolated line patterns (1L5S, design dimensions: 0.20 μm) resolved at an optimum dose was within the range of "design dimensions ±10%" was taken as a standard for resolution of the isolated line pattern.

Depth of Focus (1L1S, 1L5S)

Line patterns (1L1S and 1L5S) with design dimensions of 0.20 μm were exposed at an optimum dose while changing the depth of focus. The range of depth of focus in which the line width of the pattern was within the range of "design dimensions ±10%" was taken as a standard for depth of focus (DOF) of each pattern. The wider range of DOF ensures increased process margin, thereby leading to high yield in the device production.

Surface Roughness

The minimum dimensions "$L_{in}$" and the maximum dimensions "$L_{out}$" of the cross-section of isolated line patterns (1L5S) with design dimensions of 0.20 μm as shown in FIG. 1 were measured using a scanning electron microscope. Surface roughness was evaluated by calculating Ld ($L_{out}-L_{in}$) according to the following standards. Note that unevenness shown in FIG. 1 is exaggerated for explanation.

Ld<0.01 μm: Good
Ld≧0.01 μm: Bad

Synthesis of Copolymer (I)

Synthesis Example 1

35 g of 4-hydroxystyrene, 15 g of 4-t-butoxystyrene, and 5 g of t-butyl acrylate were dissolved in 55 g of dioxane. After the addition of 10 g of 2,2'-azobisisobutyronitrile, nitrogen gas was bubbled through the mixture for 30 minutes. The mixture was then polymerized at 60° C. for 7 hours while bubbling. After polymerization, the reaction solution was caused to coagulate in a large quantity of hexane to recover a resin. The resin was dissolved in acetone and was then caused to coagulate in hexane again. This operation was repeated several times to remove unreacted monomers. The resin was dried at 50° C. overnight under reduced pressure to obtain a white resin.

As a result of $^1$H-NMR analysis, the resulting resin was found to be a copolymer of 4-hydroxystyrene, 4-t-butoxystyrene, and t-butyl acrylate with a copolymerization molar ratio of approximately 7:2:1. Mw and Mw/Mn of this resin were respectively 12,000 and 1.7.

This resin is referred to as a "resin (I-1)".

Synthesis Example 2

A white resin was obtained in the same manner as in Synthesis Example 1 except for using 30 g of 4-hydroxystyrene and 20 g of 4-t-butoxystyrene.

As a result of $^1$H-NMR analysis, the resulting resin was found to be a copolymer of 4-hydroxystyrene and 4-t-butoxystyrene with a copolymerization molar ratio of approximately 7:3. Mw and Mw/Mn of this resin were respectively 13,000 and 1.7.

This resin is referred to as a "resin (I-2)".

Synthesis Example 3

A white resin was obtained in the same manner as in Synthesis Example 1 except for using 32 g of 4-hydroxystyrene, 14 g of 4-t-butoxystyrene, and 4 g of styrene as monomers.

As a result of $^1$H-NMR analysis, the resulting resin was found to be a copolymer of 4-hydroxystyrene, 4-t-butoxystyrene, and styrene with a copolymerization molar ratio of approximately 7:2:1. Mw and Mw/Mn of this resin were respectively 12,000 and 1.8.

This resin is referred to as a "resin (I-3)".

Synthesis Example 4

95 g of 4-acetoxystyrene, 30 g of 4-t-butoxystyrene, and 4 g of 2,5-dimethyl-2,5-hexanediol diacrylate were mixed with 265 g of propylene glycol monomethyl ether to prepare a homogenous solution. Nitrogen gas was bubbled through the mixture for 30 minutes. After the addition of 9 g of 2,2'-azobisisobutylonitrile and 6 g of t-dodecylmercaptan, the mixture was polymerized at 70° C. for 24 hours while bubbling. After polymerization, the reaction solution was caused to coagulate in a large quantity of hexane to recover a resin. The resin was dissolved in acetone and was then caused to coagulate in hexane again. This operation was repeated several times to remove unreacted monomers. The resin was dried at 50° C. for 24 hours under reduced pressure to obtain a white resin.

50 g of this resin was mixed with 500 g of methanol, 20 g of triethylamine, and 10 g of water. The mixture was then hydrolyzed for 8 hours while heating under reflux. The reaction solution was caused to coagulate in a 1 wt % oxalic acid aqueous solution. The coagulated resin was dried at 50° C. for 24 hours under reduced pressure to obtain a white resin.

As a result of $^{13}$C-NMR and $^1$H-NMR analysis, the resulting resin was found to be a copolymer of 4-hydroxystyrene, 4-t-butoxystyrene, and 2,5-dimethyl-2,5-hexanediol diacrylate with a copolymerization molar ratio of 7.3:2.4:0.3. Mw and Mw/Mn of this resin were respectively 38,000 and 2.9.

This resin is referred to as a "resin (I-4)".

Synthesis of Copolymer (II)

Synthesis Example 5

176 g of 4-t-butoxystyrene was anionically polymerized at −78° C. in 500 ml of tetrahydrofuran using s-butyllithium as a catalyst. After polymerization, the reaction solution was caused to coagulate in a large quantity of methanol to recover a resin.

The resin was dissolved in 600 g of dioxane. After the addition of diluted hydrochloricacid, the mixture was hydrolyzed at 70° C. for 6 hours. The reaction product was caused to coagulate in a large quantity of water to obtain a white resin. The resin was dissolved in acetone and was then caused to coagulate in a large quantity of water again. This operation was repeated to remove unreacted monomers. The resin was filtered and dried at 50° C. overnight under reduced pressure to obtain a white resin.

As a result of $^{13}$C-NMR analysis, the resulting resin was confirmed to be a copolymer in which only part of t-butyl groups of poly(4-t-butotoxystyrene) was hydrolyzed and of which the copolymerization molar ratio of 4-butoxystyrene and 4-hydroxystyrene was 15:85. Mw and Mw/Mn of this resin were respectively 10,400 and 1.01.

Then, 26 g of this copolymer was dissolved in 100 g of t-butyl acetate. Nitrogen gas was bubbled through the mixture for 30 minutes. After the addition of 5.5 g of cyclohexyl vinyl ether and 1 g of pyridinium p-toluenesulfonate as a catalyst, the mixture was allowed to react at room temperature for 12 hours while bubbling. The reaction solution was caused to coagulate in a large quantity of 1 wt % ammonium aqueous solution. The coagulated copolymer was filtered and dried at 50° C. overnight under reduced pressure.

As a result of $^{13}$C-NMR analysis, the resulting resin was found to have a structure in which 15 mol % of hydrogen atoms of a phenolic hydroxyl group in poly(4-hydroxystyrene) was replaced by 1-cyclohexyloxyethyl groups and 15 mol % of hydrogen atoms replaced by t-butyl groups. Mw and Mw/Mn of this resin were respectively 12,000 and 1.01.

This copolymer is referred to as a "copolymer (II-1)".

Synthesis Example 6

24 g of poly(4-hydroxystyrene) with Mw of 12,000 was dissolved in 100 g of dioxane. Nitrogen gas was bubbled through the mixture for 30 minutes. After the addition of 6 g of ethyl vinyl ether and 1 g of pyridinium p-toluenesulfonate as a catalyst, the mixture was allowed to react for 12 hours while bubbling. The reaction solution was caused to coagulate in a large quantity of 1 wt % ammonium aqueous solution. The coagulated copolymer was filtered and dried at 50° C. overnight under reduced pressure.

As a result of $^{13}$C-NMR analysis, the resulting resin was found to have a structure in which 35 mol % of hydrogen atoms of a phenolic hydroxyl group in poly(4-hydroxystyrene) was replaced by 1-ethoxyethyl groups. Mw and Mw/Mn of this resin were respectively 15,000 and 1.6.

This resin is referred to as a "copolymer (II-2)".

Synthesis of Resin (b)

Synthesis Example 7

100 g of 4-acetoxystyrene, 25 g of t-butyl acrylate, 18 g of styrene, 6 g of azobisisobutyronitrile, and 1 g of t-dodecylmercaptan were dissolved in 230 g of propylene glycol monomethyl ether. The mixture was polymerized at 70° C. for 16 hours in a nitrogen atmosphere. After polymerization, the reaction solution was caused to coagulate in a large quantity of hexane to recover a resin.

After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and was caused to coagulate in a large quantity of water. The coagulated resin was filtered and was dried at 50° C. overnight under reduced pressure.

As a result of $^{13}$C-NMR analysis, the resulting resin was found to be a copolymer of 4-hydroxystyrene, t-butyl acrylate, and styrene with a copolymerization molar ratio of 61:19:20. Mw and Mw/Mn of this resin were respectively 11,500 and 1.6.

This resin is referred to as a "resin (b-1)".

Synthesis Example 8

7 g of di-t-butyl carbonate was added to a solution in which 12 g of poly(4-hydroxystyrene) with Mw of 12,000 and 5 g of triethylamine were dissolved in 50 g of dioxane while stirring. The mixture was stirred for 6 hours at room temperature. Oxalic acid was then added to neutralize triethylamine. The reaction solution was caused to coagulate in a large quantity of water. The coagulated resin was washed with deionized water several times. The resin was then filtered and dried at 50° C. overnight under reduced pressure.

As a result of $^{13}$C-NMR analysis, the resulting resin was found to have a structure in which 30 mol % of hydrogen atoms of a phenolic hydroxyl group in poly(4-hydroxystyrene) was replaced by t-butoxycarbonyl groups. Mw and Mw/Mn of this resin were respectively 9,200 and 1.8.

This resin is referred to as a "resin (b-2)".

Examples 1–11 and Comparative Examples 1–3

Components shown in Table 1 (part(s) indicates part(s) by weight) were mixed to prepare homogeneous solutions. The solutions were filtered using a membrane filter with a pore diameter of 0.2 μm to prepare composition solutions. The composition solutions were spin-coated on a silicon wafer and pre-baked under the conditions shown in Table 2 to form resist coatings with a thickness of 0.5 μm.

The resist coatings were exposed under the conditions shown in Table 2 using a stepper "NSR2205 EX12B" (manufactured by Nikon Corp., numerical aperture: 0.55) in Examples 1–9 and Comparative Examples 1–3. In Examples 10 and 11, the resist coatings were exposed using an electron beam lithography system "HL700" (manufactured by Hitachi, Ltd., acceleration voltage: 30 KeV) in which the acceleration voltage was remodeled to 50 KeV. PEB was the performed under the conditions shown in Table 2. The resist coatings were developed at 23° C. for 1 minute by a paddle method using a 2.38 wt % tetramethyl ammonium hydroxide aqueous solution. The resist coatings were then washed with deionized water and dried to form a resist pattern.

The results of the evaluation of each resist are shown in Table 3.

TABLE 1

| | Acid ganerator (part(s)) | Copolymer or resin (b) (part(s)) | Acid diffusion controller (part(s)) | Solvent (part(s)) |
|---|---|---|---|---|
| Example 1 | A-1 (3) | I-1 (100) | C-1 (0.30) | D-1 (400) |
| | | | | D-2 (200) |
| Example 2 | A-2 (3) | I-4 (100) | C-3 (0.20) | D-1 (400) |
| | | | | D-3 (200) |
| Example 3 | A-3 (3) | I-3 (100) | C-1 (0.15) | D-1 (200) |
| | | | C-3 (0.10) | D-3 (400) |
| Example 4 | A-4 (2) | I-2 (80) | c-2 (0.10) | D-1 (600) |
| | | II-2 (20) | | |
| Example 5 | A-1 (2) | I-1 (100) | C-2 (0.15) | D-4 (600) |
| | a-1 (1) | | C-3 (0.10) | |
| Example 6 | A-3 (2) | I-3 (50) | C-4 (0.10) | D-3 (600) |
| | a-2 (4) | b-1 (50) | C-5 (0.10) | |

TABLE 1-continued

| | Acid ganerator (part(s)) | Copolymer or resin (b) (part(s)) | Acid diffusion controller (part(s)) | Solvent (part(s)) |
|---|---|---|---|---|
| Example 7 | A-2 (2) a-2 (5) a-3 (1) | I-4 (100) | C-4 (0.20) | D-1 (400) D-2 (200) |
| Example 8 | A-1 (2) a-4 (6) | II-1 (100) | C-3 (0.20) | D-3 (600) |
| Example 9 | A-2 (2) | II-1 (50) b-2 (50) | C-3 (0.20) | D-1 (200) D-3 (400) |
| Example 10 | A-3 (2) a-5 (2) | I-2 (100) | C-3 (0.20) | D-1 (100) D-2 (500) |
| Example 11 | A-4 (2) a-6 (2) | I-2 (100) | C-3 (0.20) | D-1 (100) D-2 (500) |
| Comparative Example 1 | a-1 (3) | II-1 (100) | C-1 (0.30) | D-3 (600) |
| Comparative Example 2 | a-3 (2) a-5 (2) | I-3 (100) | C-3 (0.20) | D-1 (400) D-4 (200) |
| Comparative Example 3 | A-4 (4) | b-2 (100) | c-2 (0.30) | D-1 (400) D-2 (200) |

TABLE 2

| | PB | | | PEB | |
|---|---|---|---|---|---|
| | Temp. (° C.) | Time (min.) | Light source | Temp. (° C.) | Time (min.) |
| Example 1 | 140 | 60 | Krf eximer laser | 140 | 60 |
| Example 2 | 130 | 60 | Krf eximer laser | 140 | 60 |
| Example 3 | 130 | 60 | Krf eximer laser | 130 | 60 |
| Example 4 | 90 | 90 | Krf eximer laser | 100 | 90 |
| Example 5 | 130 | 60 | Krf eximer laser | 130 | 60 |
| Example 6 | 120 | 60 | Krf eximer laser | 130 | 60 |
| Example 7 | 130 | 60 | Krf eximer laser | 130 | 60 |
| Example 8 | 90 | 90 | Krf eximer laser | 110 | 90 |
| Example 9 | 100 | 90 | Krf eximer laser | 100 | 90 |
| Example 10 | 130 | 60 | Electron beams | 130 | 60 |
| Example 11 | 130 | 60 | Electron beams | 130 | 60 |
| Comparative Example 1 | 100 | 90 | Krf eximer laser | 100 | 90 |
| Comparative Example 2 | 130 | 60 | Krf eximer laser | 130 | 60 |
| Comparative Example 3 | 130 | 60 | Krf eximer laser | 130 | 60 |

TABLE 3

| | sensitivity | Resolution ($\mu$m) | | DOF ($\mu$m) | | Sueface roughness |
|---|---|---|---|---|---|---|
| | | 1L1S | 1L5S | 1L1S | 1L5S | |
| Example 1 | 28 mJ/cm$^2$ | 0.18 | 0.15 | 1.0 | 0.8 | Good |
| Example 2 | 28 mJ/cm$^2$ | 0.18 | 0.15 | 1.0 | 0.8 | Good |
| Example 3 | 28 mJ/cm$^2$ | 0.18 | 0.15 | 1.0 | 0.8 | Good |
| Example 4 | 28 mJ/cm$^2$ | 0.18 | 0.15 | 1.0 | 0.8 | Good |
| Example 5 | 28 mJ/cm$^2$ | 0.17 | 0.15 | 1.4 | 0.8 | Good |
| Example 6 | 27 mJ/cm$^2$ | 0.17 | 0.15 | 1.4 | 0.8 | Good |
| Example 7 | 26 mJ/cm$^2$ | 0.17 | 0.15 | 1.4 | 0.8 | Good |
| Example 8 | 28 mJ/cm$^2$ | 0.18 | 0.15 | 1.0 | 0.8 | Good |
| Example 9 | 28 mJ/cm$^2$ | 0.18 | 0.15 | 1.0 | 0.8 | Good |
| Example 10 | 5 $\mu$J/cm$^2$ | 0.17 | 0.16 | — | — | Good |
| Example 11 | 4 $\mu$J/cm$^2$ | 0.17 | 0.16 | — | — | Good |
| Comparative Example 1 | 28 mJ/cm$^2$ | 0.19 | 0.17 | 0.8 | 0.6 | Bad |
| Comparative Example 2 | 33 mJ/cm$^2$ | 0.18 | 0.17 | 1.0 | 0.5 | Bad |
| Comparative Example 3 | 36 mJ/cm$^2$ | 0.19 | 0.16 | 0.8 | 0.6 | Bad |

The acid generators (A), other acid generators, acid diffusion controllers, and solvents used in the Examples and Comparative Examples are as follows.

Acid Generator (A)
A-1: Bis(4-t-butylphenyl)iodonium 2,4-difluorobenzenesulfonate
A-2: Bis(4-t-butylphenyl)iodonium 4-trifluoromethylbenzenesulfonate
A-3: Bis(4-t-butylphenyl)iodonium 2-trifluoromethylbenzenesulfonate
A-4: Triphenylsulfonium 2,4-difluorobenzenesulfonate Other Acid Generators
a-1: Bis(4-t-butylphenyl)iodonium p-toluenesulfonate
a-2: N-(trifluoromethylsulfonyloxy)bicyclo[2.2.1]hept-5-ene-2,3-dicarboxyimide
a-3: Bis(4-t-butylphenyl)iodonium 10-camphorsulfonate
a-4: Bis(cyclohexylsulfonyl)diazomethane
a-5: Triphenylsulfonium trifluoromethanesulfonate
a-6: Bis(4-t-butylphenyl)iodonium nonafluoro-n-butanesulfonate Acid Diffusion Controller
C-1: Tri-n-octylamine
C-2: Dicyclohexylamine
C-3: N,N,N,N-Tetrakis(2-hydroxypropyl)ethylenediamine
C-4: 2-Phenylbenzimidazole
C-5: 2-Phenylpyridine Solvent
D-1: Ethyl lactate
D-2: Ethyl 3-ethoxypropionate
D-3: Propylene glycol monoethyl ether acetate
D-4: 2-Heptanone As described above, the radiation-sensitive resin composition of the present invention exhibits high sensitivity to various types of radiation, has sufficient resolution and depth of focus, and is capable of forming a fine pattern with small surface roughness when forming various patterns such as a dense line pattern, isolated line pattern, or contact holes, particularly line-type patterns. Therefore, the radiation-sensitive resin composition of the present invention is suitable as a chemically-amplified resist used for fabricating semiconductor devices which will become more and more minute.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition comprising:
   (A) an aromatic sulfonic acid onium salt compound shown by the following formula (1), $$Z^+X^- \quad (1)$$

wherein $Z^+$ represents an onium cation of sulfur or iodine, and $X^-$ represents an anion shown by any of the following formulas (1-1) to (1-3);

(1-1)

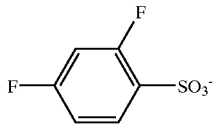

(1-2)

(1-3)

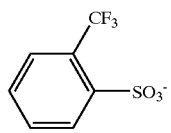

and (B) either one or both of a copolymer (I) which comprises a recurring unit shown by the following formula (2) and a recurring unit shown by the following formula (3), (2)

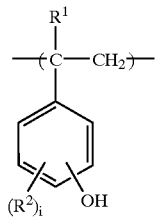

wherein $R^1$ represents a hydrogen atom or a methyl group, $R^2$ represents a halogen atom or an organic group having 1–6 carbon atoms, and i is an integer from 0 to 3;

(3)

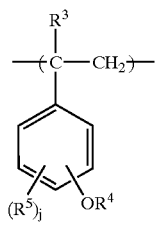

wherein $R^3$ represents a hydrogen atom or a methyl group, $R^4$ represents a tertiary alkyl group having 4–10 carbon atoms, $R^5$ represents a halogen atom or an organic group having 1–6 carbon atoms, and j is an integer from 0 to 3; and a copolymer (II) which comprises a recurring unit shown by the formula (2) and a recurring unit shown by the following formula (4), (4)

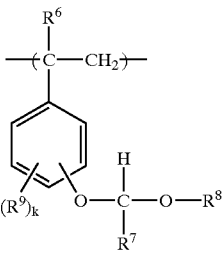

wherein $R^6$ represents a hydrogen atom or a methyl group, $R^7$ represents a linear, branched, or cyclic alkyl group having 1–6 carbon atoms, $R^8$ represents a linear, branched, or cyclic alkyl group having 1–6 carbon atoms, $R^9$ represents a halogen atom or an organic group having 1–6 carbon atoms, and k is an integer from 0 to 3.

2. The radiation-sensitive resin composition according to claim 1, wherein $Z^+$ in the formula (1) represents an onium cation shown by the following formula (5) or (6):

(5)

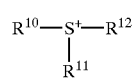

wherein $R^{10}$ to $R^{12}$ individually represent a substituted or unsubstituted alkyl group having 1–16 carbon atoms (including the carbon number of the substituent, hereinafter the same) or a substituted or unsubstituted aryl group having 6–22 carbon atoms, provided that at least one of $R^{10}$ to $R^{12}$ represents the aryl group, or at least two of $R^{10}$ to $R^{12}$ bond to form a ring with the sulfur atom, with the remainder being the alkyl group or aryl group, provided that an aromatic ring is included in the formula;

(6)

wherein $R^{13}$ and $R^{14}$ individually represent a substituted or unsubstituted aryl group having 6–22 carbon atoms, or $R^{13}$ and $R^{14}$ bond to form a ring with the iodine atom, provided that an aromatic ring is included in the formula.

3. The radiation-sensitive resin composition according to claim 1, wherein the monomers which provide the recurring unit (2) in the copolymer (I) is at least one compound selected from the group consisting of 4-hydroxystyrene, 3-hydroxystyrene, 2-hydroxystyrene, 4-hydroxy-α-methylstyrene, 3-hydroxy-α-methylstyrene, 2-hydroxy-α-methylstyrene, 3-methyl-4-hydroxystyrene, and 3-methyl-4-hydroxy-α-methylstyrene.

4. The radiation-sensitive resin composition according to claim 1, wherein the monomers which provide the recurring unit (3) in the copolymer (I) is at least one compound selected from the group consisting of 4-t-butoxystyrene, 3-t-butoxystyrene, 2-t-butoxystyrene, 4-t-butoxy-α-methylstyrene, 3-t-butoxy-α-methylstyrene, 2-t-butoxy-α-methylstyrene, 3-methyl-4-t-butoxystyrene, 3-methyl-4-t-butoxy-α-methylstyrene, 4-(1',1'-dimethylpropoxy)styrene, and 4-(1',1'-dimethylpropoxy)-α-methylstyrene.

5. The radiation-sensitive resin composition according to claim 1, wherein the content of the recurring unit (2) in the copolymer (I) is 20–90 mol % of the total amount of the recurring units.

6. The radiation-sensitive resin composition according to claim 1, wherein the content of the recurring unit (3) in the copolymer (I) is 10–50 mol % of the total amount of the recurring units.

7. The radiation-sensitive resin composition according to claim 1, wherein the monomers which provide the recurring unit (4) in the copolymer (II) is at least one compound selected from the group consisting of 4-methoxymethoxystyrene, 3-methoxymethoxystyrene, 2-methoxymethoxystyrene, 3-methyl-4-methoxymethoxystyrene, 4-methoxymethoxy-α-methylstyrene, 3-methoxymethoxy-α-methylstyrene, 2-methoxymethoxy-α-methylstyrene, 3-methyl-4-methoxymethoxy-α-methylstyrene, 4-ethoxymethoxystyrene, 3-ethoxymethoxystyrene, 2-ethoxymethoxystyrene, 3-methyl-4-ethoxymethoxystyrene, 4-ethoxymethoxy-α-methylstyrene, 3-ethoxymethoxy-α-methylstyrene, 2-ethoxymethoxy-α-methylstyrene, 3-methyl-4-ethoxymethoxy-α-methylstyrene, 4-cyclohexyloxymethoxystyrene, 4-cyclohexyloxymethoxy-α-methylstyrene, 4-(1'-methoxyethoxy)styrene, 3-(1'-methoxyethoxy)styrene, 2-(1'-methoxyethoxy)styrene, 3-methyl-4-(1'-methoxyethoxy)styrene, 4-(1'-methoxyethoxy)-α-methylstyrene, 3-(1'-methoxyethoxy)-α-methylstyrene, 2-(1'-methoxyethoxy)-α-methylstyrene, 3-methyl-4-(1'-ethoxyethoxy)-α-methylstyrene, 4-(1'-ethoxyethoxy)styrene, 3-(1'-ethoxyethoxy)styrene, 2-(1'-ethoxyethoxy)styrene, 3-methyl-4-(1'-ethoxyethoxy)styrene, 4-(1'-ethoxyethoxy)-α-methylstyrene, 3-(1'-ethoxyethoxy)-α-methylstyrene, 2-(1'-ethoxyethoxy)-α-methylstyrene, 3-methyl-4-(1'-ethoxyethoxy)-α-methylstyrene, 4-(1'-cyclohexyloxyethoxy)styrene, and 4-(1'-cyclohexyloxyethoxy)-α-methylstyrene.

8. The radiation-sensitive resin composition according to claim 1, wherein the monomers which provide the recurring unit (4) in the copolymer (II) is at least one compound selected from the group consisting of 4-(1'-methoxyethoxy)styrene, 4-(1'-ethoxyethoxy)styrene, and 4-(1'-cyclohexyloxyethoxy)styrene.

9. The radiation-sensitive resin composition according to claim 1, wherein the content of the recurring unit (2) in the copolymer (II) is 10–95 mol % of the total amount of the recurring units.

10. The radiation-sensitive resin composition according to claim 1, wherein the content of the recurring unit (4) in the copolymer (II) is 5–70 mol % of the total amount of the recurring units.

11. The radiation-sensitive resin composition according to claim 1, wherein the copolymer (II) further comprises the recurring unit (3).

12. The radiation-sensitive resin composition according to claim 11, wherein the content of the recurring units (3) and (4) in the copolymer (II) in total is 10–70 mol % of the total amount of the recurring units.

13. The radiation-sensitive resin composition according to claim 1, wherein the copolymer (I) or (II) further comprises other recurring units and monomers which provide the other recurring units is at least one compound selected from the group consisting of styrene, 4-methoxystyrene, 4-acetoxystyrene, isobornyl acrylate, and tricyclodecanyl acrylate.

14. The radiation-sensitive resin composition according to claim 1, wherein the copolymer (I) or (II) is a resin into which a branched structure is introduced using a polyfunctional monomer having two or more polymerizable unsaturated bonds.

15. The radiation-sensitive resin composition according to claim 1, wherein the polystyrene-reduced weight average molecular weight (Mw) of either one or both of the copolymer (I) and copolymer (II) is 1,000–100,000.

16. The radiation-sensitive resin composition according to claim 1, further comprising a resin insoluble or scarcely soluble in alkali which has a structure in which a hydrogen atom of an acidic functional group in an alkali-soluble resin having at least one recurring unit shown by the following formulas (10) to (13) is replaced by one or more acid-dissociable groups which dissociate in the presence of an acid,

(10)

wherein $R^{15}$ represents a hydrogen atom or a methyl group, $R^{16}$s individually represent a halogen atom or a monovalent organic group having 1–6 carbon atoms, and m is an integer from 0 to 3;

(11)

wherein $R^{17}$ represents a hydrogen atom or a methyl group;

(12)

(13)

wherein $R^{18}$ to $R^{22}$ individually represent a hydrogen atom or a linear or branched alkyl group having 1–4 carbon atoms.

17. The radiation-sensitive resin composition according to claim 1, further comprising a nitrogen-containing compound as an acid diffusion controller.

18. The radiation-sensitive resin composition according to claim 1, further comprising a nonionic surfactant.

* * * * *